(12) United States Patent
Zinn

(10) Patent No.: US 8,834,747 B2
(45) Date of Patent: Sep. 16, 2014

(54) COMPOSITIONS CONTAINING TIN NANOPARTICLES AND METHODS FOR USE THEREOF

(75) Inventor: Alfred A. Zinn, Palo Alto, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 98 days.

(21) Appl. No.: 13/040,207

(22) Filed: Mar. 3, 2011

(65) Prior Publication Data

US 2011/0215279 A1 Sep. 8, 2011

Related U.S. Application Data

(60) Provisional application No. 61/310,533, filed on Mar. 4, 2010.

(51) Int. Cl.
| | | |
|---|---|---|
| H01B 1/02 | (2006.01) |
| H01B 1/22 | (2006.01) |
| B22F 1/00 | (2006.01) |
| B22F 3/00 | (2006.01) |
| B22F 1/02 | (2006.01) |
| B22F 9/00 | (2006.01) |
| C21B 3/02 | (2006.01) |
| C21B 5/02 | (2006.01) |
| C21B 7/06 | (2006.01) |
| C21B 15/04 | (2006.01) |
| C21C 5/02 | (2006.01) |
| C21C 7/04 | (2006.01) |
| C22B 7/04 | (2006.01) |
| C22B 9/10 | (2006.01) |
| C22B 5/20 | (2006.01) |
| C22C 1/06 | (2006.01) |
| C22C 1/04 | (2006.01) |
| C22C 7/00 | (2006.01) |
| C22C 9/02 | (2006.01) |
| C22C 9/06 | (2006.01) |
| C22C 11/00 | (2006.01) |
| C22C 12/00 | (2006.01) |
| C22C 13/00 | (2006.01) |
| C22C 20/00 | (2006.01) |
| C22C 21/00 | (2006.01) |
| C22C 24/00 | (2006.01) |
| C22C 25/00 | (2006.01) |
| C22C 28/00 | (2006.01) |
| C22F 1/16 | (2006.01) |
| B23K 35/26 | (2006.01) |
| H05K 1/09 | (2006.01) |
| B22F 9/24 | (2006.01) |

(52) U.S. Cl.
CPC ... H01B 1/22 (2013.01); *C22F 1/16* (2013.01); *B22F 1/0062* (2013.01); *B23K 35/262* (2013.01); *C01P 2004/62* (2013.01); *B22F 1/0018* (2013.01); *H05K 1/092* (2013.01); *C01P 2004/64* (2013.01); *B22F 9/24* (2013.01); *Y10S 977/773* (2013.01); *Y10S 977/777* (2013.01)
USPC ........... 252/513; 252/512; 977/773; 977/777; 420/557; 420/560; 75/313; 75/314; 75/228; 75/255; 75/343; 148/400; 148/433; 148/435

(58) Field of Classification Search
USPC ....................................................... 252/500
See application file for complete search history.

(56) References Cited

U.S. PATENT DOCUMENTS

| | | |
|---|---|---|
| 3,332,916 A | 7/1967 | Hay |
| 3,637,508 A | 1/1972 | Willsey et al. |
| 5,147,841 A | 9/1992 | Wilcoxon |
| 5,159,171 A | 10/1992 | Cook et al. |
| 5,800,650 A | 9/1998 | Anderson et al. |
| 5,958,590 A | 9/1999 | Kang et al. |
| 6,143,356 A | 11/2000 | Jablonski |
| 6,645,444 B2 | 11/2003 | Goldstein |
| 6,783,569 B2 | 8/2004 | Cheon et al. |
| 7,306,823 B2 | 12/2007 | Sager et al. |

(Continued)

FOREIGN PATENT DOCUMENTS

| | | | |
|---|---|---|---|
| EP | 1921176 A2 | 5/2008 |
| JP | 2009006337 A | * | 1/2009 |

(Continued)

OTHER PUBLICATIONS

Lin et al. The influence of nano-particles on microstructural development at the interface of Sn3.5Ag-solder and Cu-substrate. Int. J. Nanomanufacturing. vol. 1, No. 3, 2007.*
Wu, et al., "Simple One-Step Synthesis of Uniform Disperse Copper Nanoparticles", Mater. Res. Soc. Symp. Proc. 2005, vol. 879E, pp. Z6.3.1-Z6.3.6.
Jiang, "Size-Dependent Melting Properties of Tin Nanoparticles," Science Direct, Chemical Physics Letters 429, 2006, pp. 492-496.

(Continued)

*Primary Examiner* — Harold Pyon
*Assistant Examiner* — Tanisha Diggs
(74) *Attorney, Agent, or Firm* — McDermott Will & Emery LLP

(57) ABSTRACT

Compositions containing tin nanoparticles and electrically conductive particles are described herein. The tin nanoparticles can have a size below about 25 nm so as to make the compositions fusable at temperatures below that of bulk tin (m.p.=232° C.). Particularly, when the tin nanoparticles are less than about 10 nm in size, the compositions can have a fusion temperature of less than about 200° C. The compositions can contain a whisker suppressant to inhibit or substantially minimize the formation of tin whiskers after tin nanoparticle fusion. In some embodiments, the compositions contain tin nanoparticles, electrically conductive particles comprising copper particles, and a whisker suppressant comprising nickel particles. Methods for using the present compositions are also described herein. The present compositions can be used as a lead solder replacement that allows rework to be performed.

24 Claims, 4 Drawing Sheets

(56) References Cited

U.S. PATENT DOCUMENTS

| | | |
|---|---|---|
| 7,419,887 B1 | 9/2008 | Quick et al. |
| 7,442,879 B2 | 10/2008 | Das et al. |
| 7,524,351 B2 | 4/2009 | Hua et al. |
| 7,559,970 B2 | 7/2009 | Kim et al. |
| 7,628,840 B2 | 12/2009 | Atsuki et al. |
| 7,637,982 B2 | 12/2009 | Hou et al. |
| 7,736,414 B1 | 6/2010 | Zinn |
| 7,743,964 B2 | 6/2010 | Maeda |
| 7,847,397 B2 | 12/2010 | Wu et al. |
| 7,850,933 B2 | 12/2010 | Yang et al. |
| 7,858,025 B2 | 12/2010 | Shim et al. |
| 2003/0100654 A1 | 5/2003 | Chheang et al. |
| 2003/0146019 A1 | 8/2003 | Hirai |
| 2004/0245648 A1 | 12/2004 | Nagasawa et al. |
| 2005/0249967 A1 | 11/2005 | Egli |
| 2006/0068216 A1 | 3/2006 | Hua et al. |
| 2006/0189113 A1 | 8/2006 | Vanheusden et al. |
| 2006/0196579 A1 | 9/2006 | Skipor et al. |
| 2007/0202304 A1 | 8/2007 | Golovko et al. |
| 2007/0290175 A1 | 12/2007 | Kim |
| 2008/0003364 A1 | 1/2008 | Ginley et al. |
| 2008/0011125 A1 | 1/2008 | Shirata et al. |
| 2008/0032132 A1 | 2/2008 | Woodfield et al. |
| 2008/0072706 A1 | 3/2008 | Lee et al. |
| 2008/0124268 A1 | 5/2008 | Yang et al. |
| 2008/0149176 A1 | 6/2008 | Sager et al. |
| 2008/0151515 A1 | 6/2008 | Das et al. |
| 2008/0159902 A1 | 7/2008 | Shim et al. |
| 2008/0160183 A1 | 7/2008 | Ide et al. |
| 2008/0278181 A1 | 11/2008 | Zhong et al. |
| 2008/0286488 A1 | 11/2008 | Li et al. |
| 2009/0029148 A1 | 1/2009 | Hashimoto et al. |
| 2009/0145765 A1 | 6/2009 | Abys et al. |
| 2009/0214764 A1 | 8/2009 | Li et al. |
| 2009/0239073 A1 | 9/2009 | Huang et al. |
| 2009/0285976 A1 | 11/2009 | Lochtman et al. |
| 2009/0301606 A1 | 12/2009 | Ueshima |
| 2010/0031848 A1 * | 2/2010 | Lee et al. .............. 106/31.13 |
| 2010/0065616 A1 | 3/2010 | Zinn |
| 2010/0075137 A1 | 3/2010 | Sinton et al. |
| 2010/0139455 A1 | 6/2010 | Tilley et al. |
| 2010/0275729 A1 | 11/2010 | Jun et al. |
| 2010/0314578 A1 | 12/2010 | Purdy |

FOREIGN PATENT DOCUMENTS

| | | | |
|---|---|---|---|
| KR | 20080010691 | * | 1/2008 |
| WO | WO 2006063134 A2 | * | 6/2006 |
| WO | WO-2009/115643 A2 | | 9/2009 |
| WO | WO-2010/036114 A2 | | 4/2010 |

\* cited by examiner

COMPOSITIONS CONTAINING TIN NANOPARTICLES AND METHODS FOR USE THEREOF

CROSS-REFERENCE TO RELATED APPLICATIONS

This application claims the benefit of priority under 35 U.S.C. §119 from U.S. Provisional Patent Application Ser. No. 61/310,533, filed Mar. 4, 2010, which is incorporated herein by reference in its entirety.

STATEMENT REGARDING FEDERALLY SPONSORED RESEARCH OR DEVELOPMENT

Not applicable.

FIELD OF THE INVENTION

The present invention generally relates to tin nanoparticles, and, more particularly, to compositions containing tin nanoparticles.

BACKGROUND

Although lead has been traditionally used in numerous industrial applications, current regulations have mandated the phase out of lead in most commercial products. For example, the European Union issued regulations in 2006 that mandated the elimination of lead from coatings and solders used in most electronic components. Other countries have issued similar mandates.

Soldering applications, particularly in electronics and vehicle manufacturing, have been heavily impacted by the ban on lead. Although many alternatives to traditional lead-based solders have been developed, the Sn/Ag/Cu (SAC) system being among the most widely used, such replacements have typically exhibited drawbacks that make them unsuitable for extreme environments such as those found in automotive, military and space vehicles, for example. Specifically, the SAC system has a significantly higher eutectic melting point (e.g., m.p. of ~217° C.) than does traditional Sn/Pb solder (m.p. of 183° C. for 63/37 Sn/Pb or 188° C. for 60/40 Sn/Pb), thus limiting its use to materials that are capable of withstanding its higher processing temperature. Further, silver is a relatively expensive component in the SAC system. From an economic standpoint, the SAC system can undesirably lead to significantly higher production costs due to the material cost of silver and the more robust components needed to withstand its higher processing temperature. Even more importantly, current SAC systems are prone to formation of tin whiskers on the solder joint over its lifetime, thereby increasing the risk of electrical shorting.

Several compositions containing nanoparticles have also been proposed as replacements for traditional lead-based solders. Nanoparticles can exhibit physical and chemical properties that sometimes differ significantly from those observed in the bulk material. For example, copper nanoparticles having sizes of less than about 20 nm can exhibit a fusion temperature that is significantly below the melting point of bulk copper. Thus, a copper nanoparticle system has been tested for use as a lead solder replacement. However, the copper nanoparticle system does not allow for easy rework when replacement of failed components becomes necessary.

In view of the foregoing, more suitable replacements for traditional lead-based solder materials are needed. The present invention satisfies this need and provides related advantages as well.

SUMMARY

In some embodiments, compositions containing tin nanoparticles and electrically conductive particles are described herein.

In some embodiments, compositions described herein contain tin nanoparticles, electrically conductive particles containing copper particles, and a whisker suppressant containing nickel particles. The compositions have a fusion temperature of less than about 200° C.

In other embodiments, methods described herein include providing a composition containing tin nanoparticles, electrically conductive particles, and a whisker suppressant; and heating the composition to a first temperature so as to at least partially fuse the tin nanoparticles together.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing a specific embodiments of the disclosure, wherein.

DETAILED DESCRIPTION

The present disclosure is directed, in part, to compositions containing tin nanoparticles. The present disclosure is also directed, in part, to methods for using compositions containing tin nanoparticles. In some embodiments, the compositions also contain electrically conductive particles and a whisker suppressant. The features of the present compositions allows them to be utilized as a soldering material that can be reworked and can have properties comparable to those of traditional Sb/Pb soldering materials.

Figure 1:
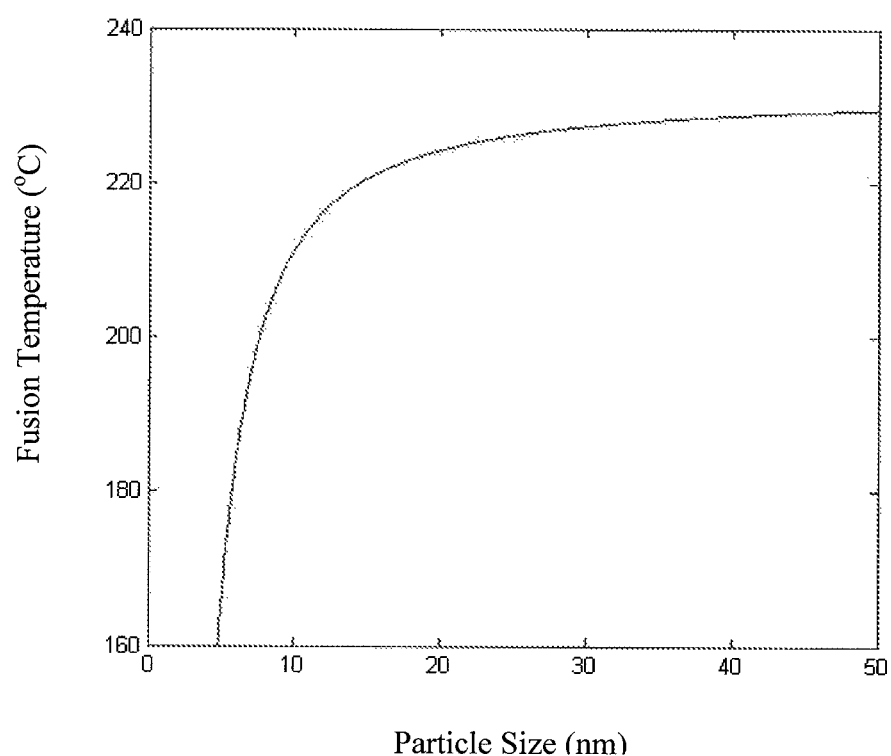
FIG. 1 shows a plot illustrating the predicted fusion temperature of tin nanoparticles as a function of size.

Compositions of the present disclosure contain tin nanoparticles, which allow the compositions to be flowable at temperatures significantly below the melting point of bulk tin (m.p.=232° C.). FIG. 1 shows a plot illustrating the predicted fusion temperature of tin nanoparticles as a function of size (see Jiang, et al. "Size-dependent melting properties of tin nanoparticles," *Chem, Phys. Lett.*, 429:2006, pp. 492-496). As shown in FIG. 1, the fusion temperature begins to significantly decrease below about 25 nm. The present compositions do not generally need to form a eutectic state in order to become flowable at such temperatures. Further, the present compositions contain highly conductive particles (e.g., metal particles) that allow their use in applications where electrical or thermal conductivity through a solder joint is needed. As such, the present compositions can be used in a variety of soldering applications including, for example, printed circuit boards and other electronic devices. In addition, the present compositions can include a whisker suppressant that inhibits or substantially minimizes the formation of tin whiskers during a solder joint's lifetime, thereby making the present compositions suitable for high performance applications including, for example, space and military vehicles.

In soldering applications, the present compositions also advantageously offer the opportunity for rework to be readily performed. In copper nanoparticle-based soldering systems, for example, the initial joining of components to one another can be conducted at relatively low temperatures due to the small sizes of the copper nanoparticles (e.g., <5 nm). However, once the copper nanoparticles become at least partially fused together after initial processing, their properties begin to approach those of bulk copper, and rework becomes much more difficult. Specifically, the temperature at which a copper nanoparticle-based soldering system becomes flowable after initial nanoparticle fusion can approach that of bulk copper (m.p.=1083° C.), thereby making replacement of a failed component very difficult. The present compositions avoid this difficulty due to tin's lower melting point, thereby allowing multiple rework operations to be performed.

From an economic standpoint, the present compositions are also very favorable. In particular embodiments described herein, the conductive particles of the present compositions can be copper particles. The ability to use copper particles in combination with tin nanoparticles represents a cost savings over using tin nanoparticles alone, since copper is less costly than tin. The present compositions are especially advantageous from an economic standpoint over soldering compositions containing significant amounts of silver (e.g., SAC systems, which can contain up to 5% silver by weight).

The nature of the present compositions and their application process can advantageously allow materials having substantially uniform porosity to be produced. This feature can lead to products having improved mechanical properties including, for example, higher vibration and thermal shock resistance. In addition, the present compositions avoid the formation of tin whiskers, which can lead to electrical shorting. Without being bound by theory or mechanism, it is believed that at least some of these beneficial features are due to the nanostructure of the present compositions. Specifically, the present compositions can retain at least some of their nanoparticle character when fused together, thereby allowing nanograins to slide or roll off of each other while retaining good strength and creep resistance. Remaining unbound by theory or mechanism, it is believed that the latter features are due to dangling bonds on the surface of the nanograins that facilitate their adherence to one another.

As used herein, the terms "fuse," "fused" or "fusion" refer to a coalescence or partial coalescence between two or more nanoparticles.

As used herein, the term "fusion temperature" refers to the temperature at which a nanoparticle liquefies, giving the appearance of melting.

As used herein, the term "nanoparticles" refers to particles having a size of less than about 100 nm in equivalent spherical diameter, although nanoparticles need not be spherical in shape.

As used herein, the term "whisker suppressant" refers to a substance that inhibits or substantially minimizes the formation of tin whiskers in a composition containing tin.

As used herein, the term "tin whiskers" refers to electrically conductive, crystalline structures of tin that sometimes grow from tin surfaces.

As used herein, the term "size range" refers to the distribution of nanoparticle sizes in a plurality of nanoparticles, such that >95% of the nanoparticles have a size residing within the indicated size range.

As used herein, the term "average size" refers to the arithmetic mean of the distribution of nanoparticle sizes in a plurality of nanoparticles.

As used herein, the term "maximum size" refers to the largest nanoparticle size observed in a plurality of nanoparticles.

As used herein, the term "tin salt" refers to any salt of tin in any of its common oxidations states, including stannous salts, i.e., Sn(II), and stannic salts, i.e., Sn(IV).

As used herein, the term "organic solvent" generally refers to polar aprotic organic solvents. Useful organic solvents of the embodiments described herein are capable of solubilizing tin salts and/or reducing agents or acting as co-solvents to solubilize tin salts and/or reducing agents.

In various embodiments, compositions containing tin nanoparticles and electrically conductive particles are described herein. In some embodiments, the tin nanoparticles are between about 1 nm and about 25 nm in size. In some embodiments, the tin nanoparticles are between about 5 nm and about 20 nm in size. In some embodiments, the tin nanoparticles are less than about 10 nm in size. In some embodiments, the tin nanoparticles are between about 1 nm and about 10 nm in size. In some embodiments, the tin nanoparticles are less than about 5 nm in size. The size of the tin nanoparticles can be readily varied through routine experimental modification, particularly to achieve a desired fusion temperature of the tin nanoparticles.

In general, larger tin nanoparticles or tin microparticles (e.g., tin particles that are more than 100 nm in size) are more prone to formation of tin whiskers during operational use and are preferably avoided in the present compositions. Further, if the size of the tin nanoparticles becomes sufficiently large, the operational benefits of a low fusion temperature in the present compositions can be lost. By utilizing tin nanoparticles in the aforementioned size range (e.g., about 10 nm or less), the present compositions can be made such that they have a fusion temperature of less than about 200° C. Additional details concerning the synthesis of tin nanoparticles are set forth hereinbelow.

In various embodiments, the present compositions can contain at least about 30% tin nanoparticles by weight. In some embodiments, the present compositions can contain about 30% to about 75% tin nanoparticles by weight. In other embodiments, the present compositions can contain about 30% to about 60% tin nanoparticles by weight. In still other embodiments, the present compositions can contain about 30% to about 50% tin nanoparticles by weight. In some embodiments, the present compositions can contain about 50% to about 70% tin nanoparticles by weight or about 40% to about 60% tin nanoparticles by weight.

In various embodiments, the present compositions also contain a whisker suppressant. Such whisker suppressants can prevent or substantially minimize the formation of tin whiskers during operational use of the present compositions. In an embodiment, a whisker suppressant for tin can be lead. However, a lead-based whisker suppressant is not viable from a commercial standpoint based on the currently mandated phase out of lead. In other embodiments, a whisker suppressant for tin can be nickel particles. Nickel particles are particularly compatible with the present compositions and can suppress tin whisker formation, while not having the environmental and health concerns presented by lead.

When present, the whisker suppressant is typically used in an amount that is as low as feasible to effectively suppress tin whisker formation. For example, in embodiments in which the whisker suppressant is nickel particles, the nickel particles can form about 1% to about 10% of the composition by weight. In other embodiments, the nickel particles can form about 1% to about 5% of the composition by weight, or about 3% to about 8% of the composition by weight.

As previously noted, the present compositions are advantageous over bulk tin, since at least some of the tin content therein can be replaced by the electrically conductive particles (e.g., another metal) and/or at least one other component. In some embodiments, the electrically conductive particles are copper particles. That is, in some embodiments, the copper particles form the balance of the present compositions. For example, in some embodiments, the present compositions contain tin nanoparticles and copper particles. In other embodiments, the present compositions contain tin nanoparticles, copper particles and nickel particles.

In various embodiments, the present compositions contain at least about 10% copper by weight. In some embodiments, the present compositions contain at least about 25% copper by weight. In some embodiments, the present compositions contain at least about 30% copper by weight. In some embodiments, the present compositions contain at least about 35% copper by weight. In some embodiments, the present compositions contain at least about 40% copper by weight. In some embodiments, the present compositions contain at least about 45% copper by weight. In some embodiments, the present compositions contain at least about 50% copper by weight. In some embodiments, the present compositions contain at least about 55% copper by weight. In some embodiments, the present compositions contain at least about 60% copper by weight. In some embodiments, the present compositions contain at least about 65% copper by weight. In some embodiments, the present compositions contain at least about 70% copper by weight. In some embodiments, the present compositions contain at least about 75% copper by weight. In some embodiments, the present compositions contain about 25% to about 70% copper by weight. In some embodiments, the present compositions contain about 25% to about 65% copper by weight. In some embodiments, the present compositions contain about 30% to about 70% copper by weight. In still other embodiments, the present compositions contain about 40% to about 70% copper by weight.

In general, the electrically conductive particles and the whisker suppressant are not required to be in the nanoparticle size range, although they are not precluded from doing so. In various embodiments, the electrically conductive particles and the whisker suppressant range from about 100 nm to about 50 μm in size. In other various embodiments, the electrically conductive particles range from about 100 nm to about 1 μm in size.

In some embodiments, at least one of the nickel particles or the copper particles is greater than about 100 nm in size. That is, in such embodiments, the nickel particles and/or the copper particles have a minimum size of at least about 100 nm. In some embodiments, the nickel particles are greater than about 100 nm in size. In some embodiments, the copper particles are greater than about 100 nm in size. In some embodiments, both the nickel particles and the copper particles are greater than about 100 nm in size.

In some embodiments, at least one of the nickel particles or the copper particles is less than about 100 nm in size. That is, in such embodiments, the nickel particles and/or the copper particles have a maximum size of at least about 100 nm. In some embodiments, the nickel particles are smaller than about 100 nm in size. In some embodiments, the copper particles are smaller than about 100 nm in size. In some embodiments, both the nickel particles and the copper particles are smaller than about 100 nm in size.

In some embodiments, the present compositions can further include additional components that are added to adjust the physical properties of the compositions. In some embodiments, the present compositions can further include at least one additional component such as, for example, silver, indium, antimony, aluminum or gallium. In some embodiments, the at least one additional composition collectively makes up less than about 5% of the composition by weight. That is, when there are two or more additional components, they are collectively present in an amount that is less than about 5% of the composition by weight. In some embodiments, the present compositions further contain silver at a concentration of less than about 5% by weight. In some embodiments, the present compositions further contain indium at a concentration of less than about 5% by weight. In some embodiments, the present compositions further contain antimony at a concentration of less than about 5% by weight. In some embodiments, the present compositions further contain aluminum at a concentration of less than about 5% by weight. In some embodiments, the present compositions further contain gallium at a concentration of less than about 5% by weight. In various embodiments, the at least one additional component has a particle size of at least about 100 nm. However, the at least one additional component can be in nanoparticle form, if desired, in some embodiments.

In other embodiments, higher concentrations of some of the additional components can be used. In some embodiments, the present compositions can further include indium and/or gallium up to a combined concentration of about 30% by weight. Although concentrations in this range can desirably lower the melting point of the present compositions, proceeding to even higher concentrations can lower the melting point to such a degree that undesirable creep and flow can occur at higher operating temperatures. In some embodiments, the present compositions can further include about 30% or less indium by weight. In other embodiments, the present compositions can further include about 25% or less indium by weight. In some embodiments, the present compositions can further include about 25% or less gallium by weight. In general, lower concentrations of indium and gallium are preferable from an economic standpoint, but higher concentrations can be used in certain specialty applications.

In some embodiments, compositions described herein contain tin nanoparticles, electrically conductive particles containing copper particles, and a whisker suppressant containing nickel particles. The compositions have a fusion temperature of less than about 200° C. In some embodiments, the tin nanoparticles are less than about 10 nm in size.

In general, the tin nanoparticles used in the embodiments described herein can be prepared by dissolving a tin salt (e.g., a stannous salt) in a solvent and adding a reducing agent in the presence of a surfactant to form the tin nanoparticles. In some embodiments described herein, the present compositions further include at least one surfactant. In some embodiments, the at least one surfactant is associated with the tin nanoparticles.

Various methods for forming the tin nanoparticles are now set forth. Syntheses of tin nanoparticles are described in commonly owned U.S. patent application Ser. No. 12/397,250, filed Mar. 3, 2009, which is incorporated herein by reference in its entirety. Related methods for preparing rhenium and copper nanoparticles are described in commonly owned U.S.

patent application Ser. No. 12/426,160, filed Apr. 17, 2009; Ser. No. 12/512,315, filed Jun. 30, 2009; and Ser. No. 12/813,463, filed Jun. 10, 2010, each of which is incorporated herein by reference in its entirety. Although the latter co-pending applications relate to the preparation of different metal nanoparticles, the techniques described therein can be modified to prepare the tin nanoparticles used in the present embodiments.

To prepare tin nanoparticles, one or more tin nanoparticle precursors (i.e., a tin salt) is added to a solvent. Illustrative tin salts suitable for forming tin nanoparticles include, for example, stannous chloride ($SnCl_2$), stannous oxide (SnO), and stannous hydroxide ($Sn(OH)_2$). Acids, bases, amines or ammonia can also be added, particularly in combination with SnO or $Sn(OH)_2$. Other suitable tin salts include, for example, other stannous halides, stannous nitrate, stannous acetate, stannous sulfate or stannous formate. One of ordinary skill in the art will recognize the benefit of choosing a tin salt that has good solubility in the solvent being employed. Moreover, the choice of the tin salt can be a function of cost and scale. For example, inexpensive stannous halide salts can be especially effective for large scale operations.

In some embodiments, the tin salt can be in a hydrated form such as, for example, a monohydrate, a dihydrate, a trihydrate, a tetrahydrate, and the like. In some embodiments, the tin salt can be dried before being used to form tin nanoparticles. In some embodiments, drying can be accomplished with heating and/or vacuum. In other embodiments, the water of hydration can be chemically removed by reaction with a drying agent such as, for example, an orthoester or thionyl chloride.

The tin salt is then mixed with a solvent such as, for example, an organic solvent. The organic solvent can be anhydrous in some embodiments. In some embodiments, the organic solvent is a polar aprotic organic solvent that is capable of at least partially solubilizing the tin salt and a reducing agent. Illustrative polar aprotic organic solvents suitable for use in the present embodiments include, for example, formamide, N,N-dimethylformamide, dimethyl sulfoxide, dimethylpropylene urea, hexamethylphosphoramide, tetrahydrofuran and methyl or ethyl ethers of glyme, diglyme, and triglyme. Concentrations of the tin salt in the solvent typically range between about 0.1 M and about 0.5 M in some embodiments, or between about 0.1 M and about 0.25 M in other embodiments, or between about 0.1 M and about 0.15 M in still other embodiments.

After adding the tin salt to the organic solvent, at least one surfactant is then added. In some embodiments, a first surfactant is used in combination with a second surfactant. In some embodiments, a first surfactant, a second surfactant and a third surfactant are used in combination with one another. Without being bound by theory or mechanism, it is believed that the surfactants help control the maximum size and size distribution range of the tin nanoparticles. Still without being bound by theory or mechanism, it is believed that the second surfactant and optional third surfactant can help control the properties of the tin nanoparticles after their synthesis. In some embodiments, the first surfactant can also possess this function. In some embodiments, the surfactants can be releasable from the tin nanoparticles upon heating so as to aid their fusion to one another. In particular, amine surfactants are particularly easily released from tin nanoparticles upon heating, thereby facilitating their rapid fusion to one another.

In some embodiments, the first surfactant can be at least one amine. In some embodiments, the second surfactant can be an amine, phosphine and/or a sulfur-containing ligand. In some embodiments, the third surfactant can be an amine or a multi-dentate amine.

In various embodiments, amine surfactants suitable for use as the first surfactant can have about 6 carbon atoms to about 20 carbon atoms (e.g., n-hexylamine, n-octylamine, and n-dodecylamine). Branched chain amines can also be used. In various embodiments, the amine surfactants can contain primary or secondary amines. In some embodiments, the amine surfactants can have significant steric bulk such as, for example, t-butyl amines (e.g., t-hexylamine and t-octylamine) and N,N'-disubstituted amines (e.g., N,N'-dimethylethylenediamine, N,N'-di-t-butylethylenediamine and N,N'-di-iso-propylethylenediamine). The corresponding methylenediamine or propylenediamine derivatives can also be used. Similarly, higher amines such as, for example, diethylenetriamine, triethylenetetramine and tetraethylenepentamine and their derivatives can also be used. Without being bound by theory or mechanism, it is believed that in such embodiments, the steric bulk of the surfactant can beneficially impede growth of large particles and increase the stability of the tin nanoparticles.

Other suitable first surfactants include, for example, pyridine, diethylenetriamine, phosphines (e.g., $PR_3$, where R is an alkyl or aryl group containing about 1 to about 16 carbon atoms), and sulfur-containing compounds (e.g., thiols: RSH, where R is an alkyl or aryl group containing about 4 to about 12 carbon atoms, and disulfides: RSR, where R is an alkyl or aryl group containing about 4 to about 10 carbon atoms). In some embodiments, suitable first surfactants can be polymeric such as, for example, polyvinylpyrrolidone (PVP). In some embodiments, PVP can used at a concentration of about 0.1% to about 0.2% by weight.

In some embodiments, the second surfactant can include surfactants listed above that can be used for the first surfactant. In some embodiments, the second surfactant can include amines (e.g., n-butylamine, t-butylamine, hexylamine, octylamine, t-octylamine, dodecylamine, dihexylamine, dicyclohexylamine, tripentylamine, diethylenetriamine, N,N'-dimethylethylenediamine, and ethylenediamine), quaternary ammonium salts (e.g., tetramethylammonium bromide and tetraethylammonium bromide), phosphines and phosphine oxides (e.g., tributylphosphine, trioctylphosphine, triphenylphosphine and oxides thereof), and sulfur-containing ligands.

In some embodiments, the surfactants can include an amine and at least one of a phosphine or a sulfur-containing compound. In some embodiments, the surfactants can include an amine, a phosphine, and a sulfur-containing compound. In some embodiments, the surfactants can include a primary aliphatic amine, a secondary aliphatic amine, a secondary diamine containing t-butyl groups or a higher multi-dentate amine. Through optimization of the surfactants, nanoparticles of a desired size and uniform size distribution can be obtained. One of ordinary skill in the art will therefore recognize that the fusion temperature of the tin nanoparticles can be controlled through routine experimental variation of the surfactants.

In some embodiments, the overall stoichiometric ratio of surfactants to tin can range between about 1:1 to about 2:1.

Tin nanoparticles can be formed by adding a reducing agent to the solution containing a tin salt and at least one surfactant. In other embodiments, the solution of the tin salt and the at least one surfactant can be added to a solution of the reducing agent. A variety of reducing agents can reduce tin salts to metallic tin nanoparticles under such conditions. In some embodiments, the reducing agent can be an alkali metal such as, for example, lithium, sodium or potassium, in the presence of a suitable catalyst. In some embodiments, the reducing agent can be lithium naphthalide, sodium naphthalide, or potassium naphthalide. In other embodiments, the reducing agent can be sodium borohydride or a like hydride reducing agent. In some embodiments, the reducing agent can be ascorbic acid or citric acid.

After or during the addition of the reducing agent, the reaction mixture is monitored for signs of tin nanoparticle formation. These signs can include, for example, a change in color and/or gas evolution. Typically, the formation of tin nanoparticles is accompanied by the appearance of a black color in the reaction mixture as the tin nanoparticles become of sufficient size. Other colors such as yellow, orange and red can also appear during tin nanoparticle growth.

In some embodiments, the addition of the reducing agent to the tin solution is conducted rapidly. In some embodiments, a rapid addition of the reducing agent can take place over about 30 seconds, or about 1 minute, or about 2 minutes, or about 3 minutes, or about 4 minutes, or about 5 minutes.

In some embodiments, the reducing agent is added in a slight stoichometric excess of up to about 15%. In some embodiments, the amount of excess reducing agent is about 1-5%. In other embodiments, the amount of excess reducing agent is about 5-10% or about 10-15%. In various embodiments, borohydride reducing agents are added at about 10-15% molar excess. In various embodiments, naphthalide reducing agents are added at a 2-5% molar excess.

In some embodiments, after formation of tin nanoparticles of a desired size has taken place, the reaction can be stopped. In some embodiments, stopping the reaction can involve cooling the reaction mixture to slow down the reaction (e.g., in a dry ice bath) and separating the tin nanoparticles from the mother liquor.

In some embodiments, after formation of tin nanoparticles of a desired size has take place, an additional surfactant can be added. In some embodiments, the additional surfactant can be a multi-dentate surfactant. The additional surfactant can also terminate the reaction in some embodiments. In addition to the benefits noted above, the additional surfactant can also protect the tin nanoparticles from the reaction mixture and arrest their further growth. In addition, the additional surfactant can inhibit oxidation of the tin nanoparticles upon exposure to air. Optionally, the additional surfactant can be added while the tin nanoparticles are still growing, such that the additional surfactant slows down but does not stop their growth.

In some embodiments, the tin nanoparticles can be isolated for storage or use in another application. In some embodiments, the tin nanoparticles can be isolated by centrifugation, accompanied by optional washing steps, and transformed to a paste or dry powder. For example, in some embodiments, the tin nanoparticles can be washed with a mixture of water and an organic solvent (e.g., hexane) to remove water soluble salts and residual organic byproducts remaining from the reaction mixture. In some embodiments, the tin nanoparticles can be isolated by lyophilizing the reaction mixture or another solution containing the tin nanoparticles. In other embodiments, the tin nanoparticles can be left in the reaction mixture and used directly in further applications.

In further embodiments, copper particles and nickel particles can be prepared using methods similar to those described above for preparing tin nanoparticles. Typically, the methods are carried out similarly using an appropriate copper or nickel salt, with the exception that the surfactant can be omitted, since larger particles are being produced. If some degree of size control is desired, a small amount (e.g., about 1-5% by volume) of an amine surfactant can be added in an embodiment. Further, differential centrifugation techniques can be used to isolate copper particles and nickel particles of a desired size range when polydisperse size ranges of these particles are produced. In alternative embodiments, commercially available copper particles and/or nickel particles can be used.

In still further embodiments, alloy particles containing tin, copper and nickel can be prepared using methods similar to those described above. Typically, such syntheses are carried out by a adding an appropriate amount of a copper salt and a nickel salt to the reaction mixture. In some embodiments, the concentrations are typically in the 1-10% range.

In some embodiments, the present disclosure describes methods using tin nanoparticles. For example, in some non-limiting embodiments, the compositions described herein can be used in soldering applications. In some embodiments, the methods described herein include providing a composition containing tin nanoparticles, electrically conductive particles, and a whisker suppressant, and heating the composition to a first temperature so as to at least partially fuse the tin nanoparticles together.

In some embodiments, the tin nanoparticles used in the present methods are less than about 10 nm in size. As noted hereinabove, tin nanoparticles of such a size can have a fusion temperature of less than about 200° C. Therefore, in some embodiments, the first temperature to which the composition is heated is less than about 200° C. so as to cause at least partial nanoparticle fusion. Depending on the heating time and temperature, among other factors, the tin nanoparticles can be completely fused together after heating. At shorter heating times or lower temperatures, however, the tin nanoparticles can become only partially fused together after heating. When the tin nanoparticles are only partially fused together after heating, they can be re-liquefied at a temperature between that of the first temperature and the melting point of bulk tin (e.g., 232° C.), since they retain at least some of their original nanoparticle properties. Therefore, the present compositions can be reworked at a temperature that is below the melting point of bulk tin in some embodiments.

In some embodiments of the present methods, the electrically conductive particles can be copper particles and the whisker suppressant can be nickel particles. In some embodiments of the present methods, the tin nanoparticles can form about 30% to about 50% of the composition by weight, and the nickel particles can form about 1% to about 10% of the composition by weight. Further, in some embodiments of the present methods, the compositions can further contain at least one surfactant that is associated with the tin nanoparticles as described in more detail above.

When copper particles and nickel particles have a particle size that is not in the nanoparticle size range, their melting points are approximately that of bulk copper (m.p.=1083° C.) and bulk nickel (m.p.=1453° C.). Thus, in such embodiments, the copper particles and the nickel particles remain substantially unaffected at the first temperature used to at least partially fuse the tin nanoparticles to one another (e.g., less than about 200° C.). That is, the copper particles and the nickel particles do not themselves melt, but they can become fused to the tin nanoparticles. Accordingly, in some embodiments of the present methods, the copper particles and the nickel particles fuse to the tin nanoparticles upon being heated. Since the copper particles and the nickel particles do not melt upon being heated, the formation of multi-element phases can be avoided, thereby keeping the melting point of the compositions at or below that of bulk tin.

In some embodiments, the present compositions can be mixed in one or more solvents. In some embodiments, the tin nanoparticles can be prepared in a first solvent, and the copper particles and nickel particles can be prepared in a second and third solvent, respectively. In such embodiments, the first, second and third solvents can be mixed together to form the compositions. In other embodiments, the tin nanoparticles and the copper and nickel particles can be prepared, isolated and then mixed together as solids to form the present compositions.

In some embodiments, the compositions can be mixed with an additive such that they have a desired consistency. For example, the compositions can be adjusted to provide the consistency of a gel, paste, paint or like material. In such embodiments, the compositions can be readily applied to a surface. In such embodiments, the compositions can be used in soldering applications to join a first member to a second member. In some embodiments, the present compositions can be mixed with an additive such as, for example, dicyclohexylamine, paraffin wax, or flux materials (e.g., formic acid, acetic acid, hexadecanoic acid, or triethanolamine) to attain a desired consistency. In some embodiments, small amounts of solvents such as, for example, ethanol, isopropanol, butanol, cyclohexanol, acetone, toluene and the like can be used to obtain a consistency suitable for ready application to a surface. In some embodiments, a solution or suspension of the composition can be partially evaporated to remove at least some of the solvent therefrom to attain a desired consistency. In embodiments in which additives or solvents are used, the gel, paste, paint or the like typically contains about 75% to about 98% of the composition by weight, with the balance being solvent and/or additive used to attain the desired consistency.

In some embodiments, the present methods can further include joining a first member to a second member with the compositions. In some embodiments, these embodiments involve soldering a first member to a second member. In such embodiments, the composition is typically placed at a desired location on a first member (e.g., an electrical connection containing connection pins or bond pads). Standard soldering techniques can be used to place the composition in a desired location. Alternately, ink jet printing techniques can be used to place the composition in a desired location, such as in printed circuit board applications, for example. For conformal coating application onto large areas, spray-on or brush-on techniques can be used. In any event, the second member can be contacted with the composition, and heat can be applied to at least partially fuse the tin nanoparticles together and join the first member together with the second member. In alternative embodiments, the desired location can be heated before or concurrently with application of the present compositions. In some embodiments, multiple solder joints can be heated in one operation to join multiple members together.

Heating to at least partially fuse the tin nanoparticles together can generally be performed by any technique known to one of ordinary skill in the art. In various embodiments, heating can be performed with a laser (e.g., laser welding), ovens, heat guns, and the like. In some embodiments, vacuum bagging techniques can be used. Vacuum bagging techniques can further aid in driving off any surfactants present in the compositions. Additionally, the pressure applied during vacuum bagging can further facilitate the at least partial fusion of tin nanoparticles to one another by further lowering their fusion temperature.

Figure 2:
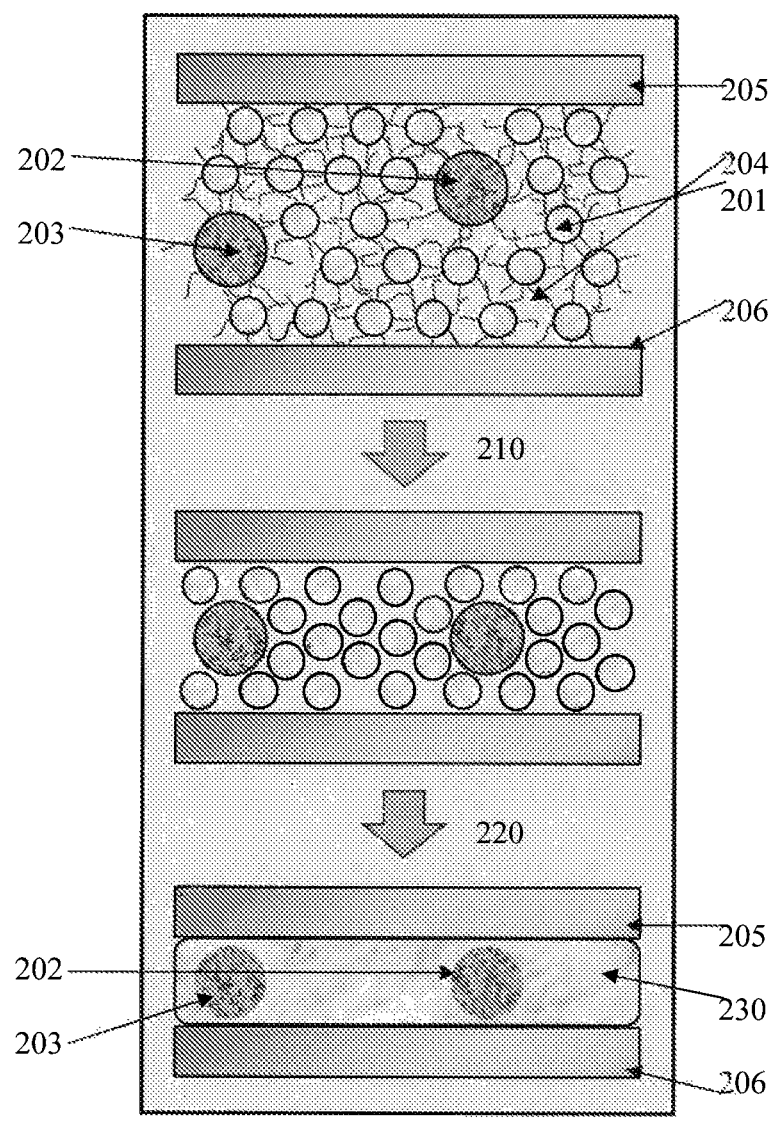
FIG. 2 shows an illustrative schematic demonstrating the joining of a first member to a second member using the present compositions.

FIG. 2 shows an illustrative schematic demonstrating the joining of a first member to a second member using the present compositions. Tin nanoparticles 201, copper particles 202 and nickel particles 203, each containing surfactants 204 thereon, are placed between first member 205 and second member 206. Heat is applied in operation 210 to drive off surfactants 204. Continued heating in operation 220 results in fusion of the tin nanoparticles 201 to each other and to copper particles 202 and nickel particles 203 to form a consolidated structure 230 joining first member 205 and second member 206.

Figure 3:
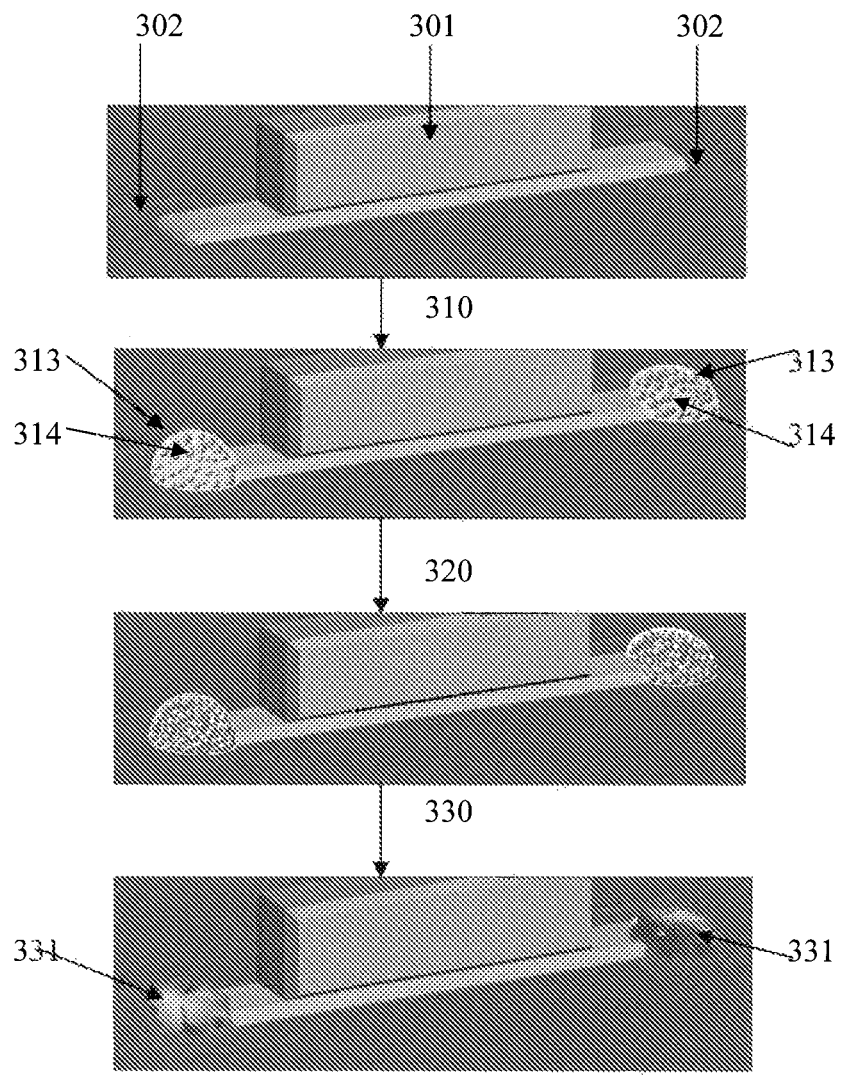
FIG. 3 shows an illustrative schematic demonstrating the joining of a component to a substrate using the present compositions.

FIG. 3 shows an illustrative schematic demonstrating the joining of a component to a substrate using the present compositions. For example, the present compositions can be used to join electronic components to circuit boards. As shown in FIG. 3, component 301 is place on substrate pads 302. In operation 310, paste 313 containing tin nanoparticles 314 is placed over component 301 and substrate pads 302. Heat is applied in operation 320 to at least partially fuse tin nanoparticles 314 together. Continued heating in operation 330 results in formation of a consolidated solder 331 joining component 301 to substrate pads 302.

An advantage of the present compositions is that they allow ready rework to be performed to replace failed components. That is, the compositions can be re-liquefied at processing temperatures at or below that of bulk tin, such that a failed component can be easily replaced. In some embodiments, the present methods further include heating the composition to a second temperature that is between the first temperature and about 232° C. (the melting point of bulk tin) so as to at least partially liquefy the composition, and then disconnecting the first member from the second member. In some embodiments, the methods can further include adding a replacement first member or second member while the composition is in a liquefied state. Heating can be accomplished by any of the aforementioned techniques. In the case of compositions containing gallium or tin, the rework temperature can be as low as about 180° C.

In some embodiments, the present compositions can be used in ink jet printing applications to directly form electrical circuits. In such embodiments, the composition is first dispersed in a solvent at a concentration that gives a solution or suspension having a consistency appropriate for ink jet printing. Thereafter, the composition is added to an ink jet printing mechanism and applied to a substrate in a defined pattern. The combined action of the ink jet spray and optional heating of the substrate can facilitate direct printing of circuits on a substrate, where the composition is in a fused state after impact on the substrate.

It is to be understood that modifications which do not substantially affect the activity of the various embodiments of this invention are also included within the definition of the invention provided herein. Accordingly, the following examples are intended to illustrate but not limit the present invention.

Example 1

Figure 4:
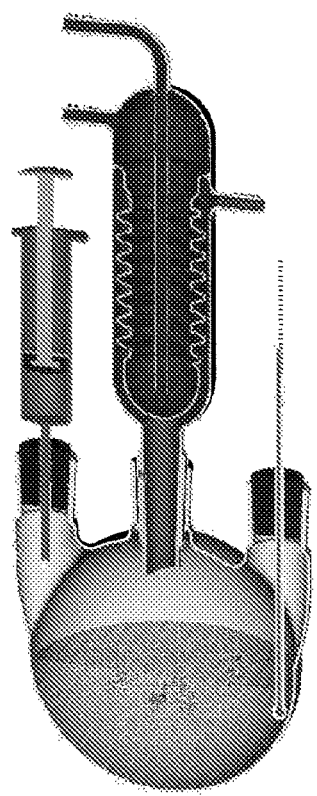
FIG. 4 shows an illustrative experimental apparatus used for synthesizing tin nanoparticles.

FIG. 4 shows an illustrative experimental apparatus used for synthesizing tin nanoparticles. A 250 mL 3 neck round bottom flask was evacuated and back filled with argon 3 times to remove air and moisture. To the flask was added 45 mL degassed diglyme, 4 mL nonylamine, and 1.9 g of anhydrous tin (II) chloride powder. The reaction mixture was then heated to 45° C. and stirred for 1 hour. Using a plastic syringe and stainless steel needle, the following surfactants were added in the order given under positive argon pressure: 6 mL dicyclohexylamine and 5 mL N,N'-di-tert-butylethylenediamine. The reaction mixture was then stirred and heated for 1 hour at 45° C.

A 2 M solution of sodium borohydride in triglyme was pre-heated to 45° C., and 11 mL of the solution was placed in an addition funnel. The sodium borohydride solution was then added to the tin-containing solution over a period of 30 seconds. The combined reaction mixture turned cloudy and gradually changed color to white, yellow-brown-orange and eventually black. At this point, the reaction mixture was cooled to −30° C. in a dry ice/acetone bath for 10 minutes.

The reaction mixture was then centrifuged at 3000 rpm for 10-15 minutes, which resulted in a very dark brown to black precipitate and a clear supernatant liquid. The black precipitate was washed with degassed 4 M aqueous $NH_3$ (3×40 mL) while sonicating for 2-4 minutes. Thereafter, the mixture was centrifuged a 3000 rpm for 10 minutes to isolate the product. The isolated product was stored in a glass vial under water containing 2-5% citric acid. The vial was also filled with argon before sealing. For long term storage, the vial was kept in a freezer maintained at −5 to −10° C.

Example 2

A 250 mL 3 neck round bottom flask was evacuated and back filled with argon 3 times to remove air and moisture. To the flask was added 25 mL trimethylorthoformate, followed by 2.2 g of tin (II) chloride hydrate powder. The reaction mixture was then stirred for 1 hour at 45° C. Thereafter, 45 mL of degassed diglyme was added to the flask, and excess trimethylorthoformate and produced methanol were boiled off. Using a plastic syringe with a stainless steel needle, the following surfactants were added in the order given under positive argon pressure: 4 mL nonylamine, 6 mL dicyclohexylamine, and 5 mL N,N'-di-tert-butylethylenediamine. The reaction mixture was then stirred and heated for 1 hour at 45° C.

A 2 M solution of sodium borohydride in triglyme was pre-heated to 45° C., and 11 mL of the solution was placed in an addition funnel. The sodium borohydride solution was then added to the tin-containing solution over a period of 30 seconds. The combined reaction mixture turned cloudy and gradually changed color to white, yellow-brown-orange and eventually black. At this point, the reaction mixture was cooled to −30° C. in a dry ice/acetone bath for 10 minutes. Workup was completed as described for EXAMPLE 1.

Although the invention has been described with reference to the disclosed embodiments, those of ordinary skill in the art will readily appreciate that these embodiments are only illustrative of the invention. It should be understood that various modifications can be made without departing from the spirit of the invention.

What is claimed is the following:

1. A composition comprising:
   tin nanoparticles;
      wherein the tin nanoparticles are prepared from a tin salt in the presence of at least one surfactant, the at least one surfactant being bound to a surface of the tin nanoparticles and also being releasable therefrom; and
      wherein the at least one surfactant comprises at least an N,N'-disubstituted ethylenediamine; and
   electrically conductive particles.

2. The composition of claim 1, wherein the tin nanoparticles are between about 1 nm and about 25 nm in size.

3. The composition of claim 1, wherein the tin nanoparticles are less than about 10 nm in size.

4. The composition of claim 1, wherein the tin nanoparticles are less than about 5 nm in size.

5. The composition of claim 1, further comprising:
   a whisker suppressant.

6. The composition of claim 5, wherein the tin nanoparticles comprise about 30% to about 50% of the composition by weight.

7. The composition of claim 6, wherein the whisker suppressant comprises nickel particles.

8. The composition of claim 7, wherein the electrically conductive particles comprise copper particles.

9. The composition of claim 8, wherein at least one of the nickel particles or the copper particles is greater than about 100 nm in size.

10. The composition of claim 8, wherein at least one of the nickel particles or the copper particles is less than about 100 nm in size.

11. The composition of claim 7, wherein the nickel particles comprise about 1% to about 10% of the composition by weight.

12. The composition of claim 7, further comprising:
   at least one additional component selected from the group consisting of silver, indium, antimony, aluminum and gallium.

13. The composition of claim 12, wherein the at least one additional component collectively comprises less than about 5% of the composition by weight.

14. The composition of claim 12, wherein the electrically conductive particles comprise copper particles.

15. The composition of claim 7, further comprising:
   about 30% or less indium by weight.

16. The composition of claim 7, further comprising:
   about 25% or less gallium by weight.

17. A method comprising:
   providing a composition comprising:
      tin nanoparticles;
         wherein the tin nanoparticles are prepared from a tin salt in the presence of at least one surfactant, the at least one surfactant being bound to a surface of the tin nanoparticles and also being releasable therefrom;
         wherein the at least one surfactant comprises at least an N,N'-disubstituted ethylenediamine;
      electrically conductive particles; and
      a whisker suppressant; and
   heating the composition to a first temperature so as to at least partially fuse the tin nanoparticles together.

18. The method of claim 17, wherein the first temperature is less than about 200° C.

19. The method of claim 18, wherein the tin nanoparticles are less than about 10 nm in size.

20. The method of claim 19, wherein the electrically conductive particles comprise copper particles and the whisker suppressant comprises nickel particles.

21. The method of claim 20, wherein the copper particles and the nickel particles fuse to the tin nanoparticles upon being heated.

22. The method of claim 20, wherein the tin nanoparticles comprise about 30% to about 50% of the composition by weight and the nickel particles comprise about 1% to about 10% of the composition by weight.

23. The method of claim 17, further comprising:
   joining a first member to a second member with the composition.

24. The method of claim 23, further comprising:
   heating the composition to a second temperature that is between the first temperature and about 232° C. so as to at least partially liquefy the composition; and
   disconnecting the first member from the second member.

* * * * *